United States Patent
Chen et al.

(10) Patent No.: US 7,176,135 B2
(45) Date of Patent: Feb. 13, 2007

(54) EBR SHAPE OF SPIN-ON LOW-K MATERIAL PROVIDING GOOD FILM STACKING

(75) Inventors: Yu-Huei Chen, Hsin-Chu (TW); Sung-Ming Jang, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 32 days.

(21) Appl. No.: 10/753,826

(22) Filed: Jan. 8, 2004

(65) Prior Publication Data
US 2005/0151227 A1    Jul. 14, 2005

(51) Int. Cl.
*H01I 21/302* (2006.01)
*H01I 21/461* (2006.01)

(52) U.S. Cl. ........................... 438/691; 438/692

(58) Field of Classification Search ........ 438/691–692, 438/778, 724; 257/171, 620
See application file for complete search history.

(56) References Cited

U.S. PATENT DOCUMENTS

| | | | |
|---|---|---|---|
| 5,783,382 A | 7/1998 | Aoyama et al. | 435/4 |
| 5,879,577 A | 3/1999 | Weng et al. | 216/92 |
| 6,080,641 A * | 6/2000 | Nihonmatsu et al. | 438/459 |
| 6,114,747 A | 9/2000 | Wei et al. | 257/620 |
| 2004/0041143 A1 * | 3/2004 | Kim et al. | 257/1 |

* cited by examiner

*Primary Examiner*—Thien F. Tran
(74) *Attorney, Agent, or Firm*—Haynes and Boone, LLP

(57) ABSTRACT

In accordance with the objectives of the invention a new method is provided to tune the Edge Bead Remove hump and to further prevent a pointed or tip shaped Edge Bead Remove edge, thus preventing peeling of the low-k dielectric film after the process of Chemical Mechanical Polishing of the low-k film.

25 Claims, 2 Drawing Sheets

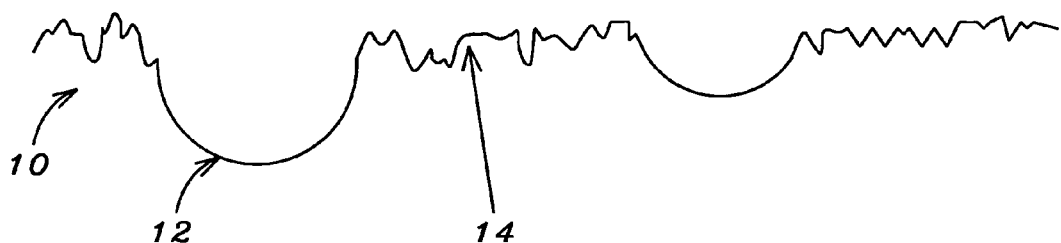
FIG. 1
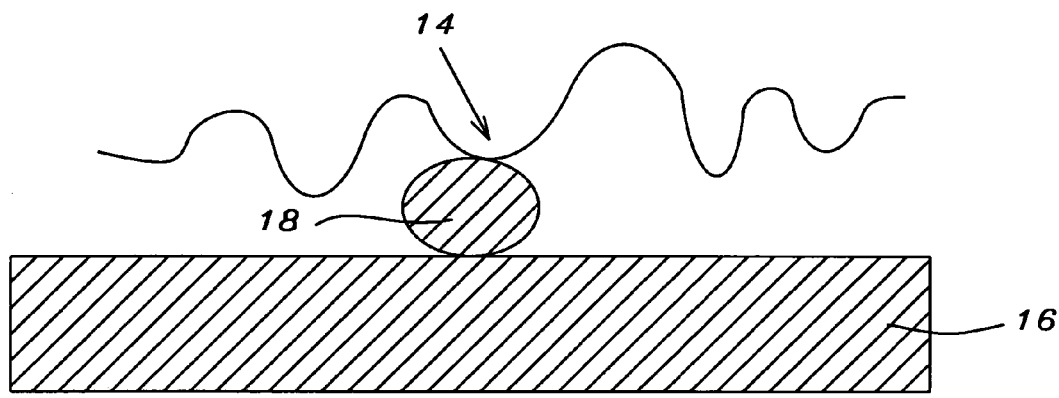
FIG. 2
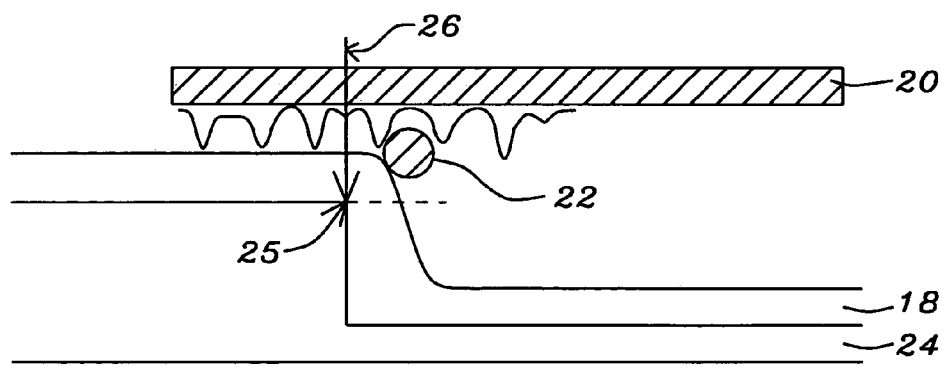
FIG. 3 – Prior Art

EBR SHAPE OF SPIN-ON LOW-K MATERIAL PROVIDING GOOD FILM STACKING

BACKGROUND OF THE INVENTION (1) Field of the Invention

The invention relates to the fabrication of integrated circuit devices, and more particularly, to a method to protect the edge of a low-k film, deposited over a semiconductor surface.

(2) Description of the Prior Art

This invention relates to controlling the creation of the outer perimeter of a semiconductor surface over which a layer of low-k dielectric has been deposited. During the manufacturing of semiconductor wafers, these wafers undergo numerous steps of processing interspersed with steps of moving the wafers between different processing stations. The wafers may also be stored during a period of process interruption of the wafer. During the handling, processing and storing of the wafers physical damage may be inflicted on the wafer.

Since the edge of the wafer is physically the most exposed, this edge is also most prone to be damaged during wafer handling. In addition, films of semiconductor materials are frequently deposited over the surface of the wafer or over the surface of a layer that has been deposited over the surface of the wafer, exposing the edge of the deposited layers of semiconductor material to damage.

Films of semiconductor material that are deposited over a layer above the surface of a wafer are frequently deposited using methods of spin coating. These methods incur centrifugal forces to the coated layer of semiconductor material, which frequently results in the coated semiconductor material accumulating, in the form of beads, around the perimeter of the wafer.

This effect is further magnified if, for reasons of deposition efficiency, the wafer is rotated during the deposition process. Since these beads, that form around the perimeter of the wafer, are extrusions from the surface of the wafer, these beads are more exposed and are therefore more prone to cause additional damage (in the form of surface chipping) to the surface of the deposited layer of semiconductor material. The chipping of the surface of deposited layers of semiconductor material readily leads to film peeling and can result in making a significant portion of the deposited layer unusable.

A frequently applied method to provide improved surface planarity and enhanced surface protection of a layer of deposited semiconductor material is to apply a layer of Spin-On-Glass (SOG) over the surface of the deposited semiconductor material.

The layer of SOG is, as the name implies, spun onto the surface of the wafer by spin coating after which the layer of SOG is heated in order to convert the (liquid) layer of SOG into a solid coating having a glassy surface.

Since the layer of SOG is applied by spinning the (liquid) SOG material over the wafer surface (the SOG is applied as small drops of SOG to the center of the spinning wafer, from where centrifugal forces distribute the SOG over the surface of the spinning wafer), an excess of SOG tends to accumulate around the perimeter of the surface over which the SOG is applied, leading to the formation of a relatively thicker layer of SOG (also referred to as edge bead) around this perimeter.

This leads to the requirement that the perimeter of the surface of semiconductor material over which the layer of SOG has been deposited must be further processed in order to remove the edge bead and to provide good planarity to the upper surface.

Methods of applying a layer of photoresist and etching the perimeter of the surface have been known in the art but are cumbersome and expensive. These methods have been augmented by modified methods of deposition of the layer of SOG such as enhancing the drop-supply of the SOG material (add SOG such that this added supply counteracts the formation of the edge bead) or by first removing the edge beads (in liquid form) before solidifying the deposited layer of SOG.

In conventional processing, low-k dielectric materials having high surface hardness are typically used to cover of layer of Inter Metal Dielectric (IMD). This is known to lead to a level of Edge Bead Remove (EBR) concentration around the perimeter of the low-k dielectric material which is unacceptable and which readily leads to peeling of the layer of low-k dielectric around the perimeter of this layer. The invention addresses this concern and provides a method that eliminates the build-up of excessive EBR around the perimeter of a layer of low-k dielectric material.

U.S. Pat. No. 6,114,747 (Wei et al.) show an edge bead removal and shaping process.

U.S. Pat. No. 5,879,577 (Weng et al.) and U.S. Pat. No. 5,783,382 (Lee et al.) are related edge bead patents.

SUMMARY OF THE INVENTION

A principle objective of the invention is to prevent the formation of edge irregularities such as edge beads or an edge hump around the perimeter of a deposited layer of low-k dielectric material.

Another objective of the invention is to prevent formation of tip-shaped irregularities around the perimeter of a deposited layer of low-k dielectric.

Yet another objective of the invention is to prevent edge peeling of a deposited layer of low-k dielectric due to a high Edge Bead Remove hump.

A still further objective of the invention is to provide a specific Edge Bead Remove in order to prevent edge peeling due to a high Edge Bead Remove hump.

A still further objective of the invention is to provide a novel Edge Bead Remove shape in order to protect the film edge of a film of low-k dielectric material having high surface hardness.

In accordance with the objectives of the invention a new method is provided to tune the Edge Bead Remove hump and to further prevent a pointed or tip shaped Edge Bead Remove edge, thus preventing peeling of the low-k dielectric film after the process of Chemical Mechanical Polishing of the low-k film.

BRIEF DESCRIPTION OF THE DRAWINGS

FIG. 1 shows a cross section of a polishing pad used for the process of Chemical Mechanical Polishing (CMP), highlighting pores and asperity in the surface of the polishing pad.

FIG. 2 shows a cross section of a asperity contact model for the process of CMP.

FIG. 3 shows a cross section of the conventional Edge Bead Remove of a low-k dielectric film.

DESCRIPTION OF THE PREFERRED EMBODIMENTS

Figure 4:
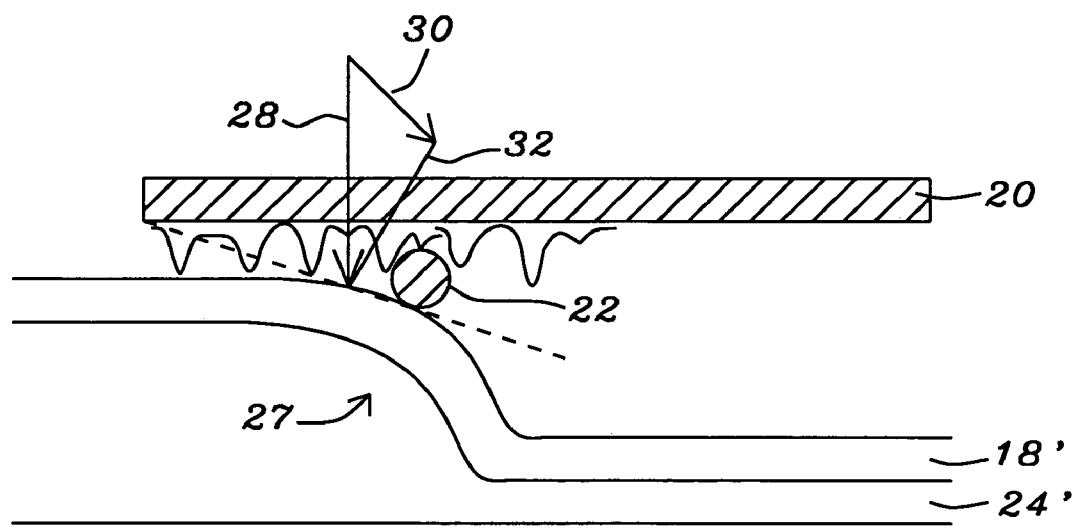
FIG. 4 shows a cross section of the Edge Bead Remove of a low-k dielectric film provided by the invention.

Background information, relating to the process of Chemical Mechanical Polishing (CMP) and the therewith used polishing pads, will be provided first. Experiments have been conducted using an IC 1000 polishing pad as the polishing pad of choice. Surface areas of the polishing pad can be distinguished, based on the surface characteristics as these characteristics relate to the polishing action, in pad pores, pad surface areas of roughness (also called pad asperity).

These surface features have been highlighted in FIG. 1. FIG. 1 is a cross section of a pad surface 10 where elements 12 represent the pad pores while elements 14 represent the surface roughness. Pad pores 12 are surface areas that are not in direct contact with the surface that is being polished and that in addition can absorb a relatively large amount of polishing slurry. The surface roughness areas 14 are surface areas that are predominantly in direct contact with the surface that is being polished and that in addition can absorb a relatively small amount of polishing slurry.

On a typical polishing pad, the surface pores (or voids) constitute about 35% of the total exposed surface area of the polishing pad, this however can be varied by applying different methods for the creation of the polishing pad. A IC 1000 pad contains polyurethane, the polishing pads are cut from bulk material (the "cake").

The cutting of the pad from the bulk material does not alter the surface distribution between the pad pores 12 and the pad surface roughness 14. This latter surface distribution further remains valid while the polishing pad is worn down (braided away) as a consequence of pad usage during CMP. The pad voids 12 are, as shown in FIG. 1, spherical in shape, having a diameter of between about 30 and 50 µm.

One of the control parameters that are used to evaluate the performance of a polishing pad is the bearing area of the polishing pad. This bearing areas is the area that makes direct contact with the surface that is being polished and that is typically expressed as a percentage of the total surface area of the polishing pad. The bearing area is determined by the number and size of the surface pores 12 and the extent and profile of the surface roughness 14.

It has been found that, since the pores 12 are relatively large in volume and since pores 12 can be randomly distributed over the surface of a polishing pad 10, pores 12 are the dominant parameter in determining the bearing area of a polishing pad.

From this follows that, when studying the changes in surface roughness as a function of conditioning and polishing activities of a polishing pad, the sampling variability that is associated with the (relatively large) pores overrides (or hides) the smaller (relative) effects of the asperity changes.

The following experimental conditions have been applied for polishing experiments that have been carried out using a commercial polisher on the surface of 200 mm wafers.

| parameter | value |
|---|---|
| down force | 6.0 psi |
| table rotating rate | 40 rpm |
| carrier rotating rate | 50 rpm |
| oscillation range | 30 mm |
| oscillation speed | 5 mm/sec |
| conditioner type | TBW Ind. 2" std. diamond grit |

| parameter | value |
|---|---|
| conditioner down force | 4.0 psi |
| conditioner table rotation rate | 75 rpm |

Comparing FIGS. 3 and 4, there is clearly a relationship between the decrease of the polish removal rate and the reduction of the asperity height. The average polish removal rate for the first minute is typical of the polish removal rates reported in the literature for these films under these polishing conditions.

The average asperity height, $R_a$, of about 2.27 µm, corresponds to actual conditions during a typical CMP operation. For an asperity contact model this means that the thickness of the slurry film is basically a thickness that fills the area around the asperity tips and the wafer surface. For the asperity heights shown here, the average slurry film thickness is only about 2–3 microns between the pores. If the pore area is included, the average slurry film thickness will be in the range between about 10 and 15 µm.

The relationship between the average asperity height and the polish removal rate is, for a test A, nearly a linear function. The polish rate decreases from about 1471 Angstrom/min to about 466 Angstrom/min while the average asperity height changes from about 2.27 µm to about 0.777 µm. This is a decrease in the polish removal rate of 68% and a decrease of the asperity height of 68%.

From FIG. 1, it is clear that the polishing system is very complex. The pad has a distribution of asperity and pores, as well as grooves. The slurry particles are fumed silica, with a size distribution of 180 +/−20 nm. The wafer surface is generally not flat but has a structure of its own. It is clearly difficult to model such a system without making use of assumptions and simplifications. However, the data of FIGS. 3 and 4 indicate the magnitudes of the structures of this system.

In previous work, the asperity and pore structures have been grouped together in evaluations. The present study has focused on the asperity on a relatively planar surface between pore openings.

FIG. 2 shows a cross section of an asperity model during the time of CMP. The slurry particle 18, an abrasive particle, is forced against the surface of the dielectric film 16 of for instance silicon dioxide, arrow 20 indicates the motion of the wafer (not shown) with respect to the polishing pad.

In addition to the above highlighted test A, a shorter test B has been performed using the same polishing conditions as have been applied for test A. The difference between test B and test A is that for test B a conditioner has been used that has been considerably less exposed to use and that therefore has a conditioning surface that is less worn. This resulted in a more abraded surface of the polishing pad and a somewhat higher polishing rate.

FIGS. 3 and 4 compare the conventional method of applying EBR with the new EBR method of the invention. Specifically highlighted n the cross section of FIG. 3 are 18, a layer of semiconductor material such as a layer of low-k dielectric that is being polished, 20 a polishing pad, 24 a surface over which layer 18 has been applied, a slurry particle 22 and 26, the downward force that is applied by the polishing pad 20 on the surface of layer 18 where this layer overlies the sharp corner, which in the cross section shown is 90 degrees, where the overlying layer 18 is in contact with the supporting surface 24.

By now significantly rounding the corner 25 of FIG. 3, and creating a corner 27 as shown in the cross section of FIG. 4, the downward force 26 is reduced and converted to the force triangle 28/30/32 that is shown in FIG. 4.

In the cross section that is shown in FIG. 4, the rounded angle 27 is highlighted as are 24', a supporting surface, 18' a layer of for instance low-k dielectric. By therefore converting corner 22, of 90 degrees, into corner 27, of a rounded nature that is not equal to 90 degrees, the EBR hump has been considerably reduced, resulting in prevention of formation of tip-shaped irregularities around the perimeter of a deposited layer of low-k dielectric, in preventing edge peeling of a deposited layer of low-k dielectric due to a high Edge Bead Remove hump, in providing a specific Edge Bead Remove in order to prevent edge peeling due to a high Edge Bead Remove hump and in providing a novel Edge Bead Remove shape in order to protect the film edge of a film of low-k dielectric material having high surface hardness.

It must be emphasized that the supporting surface 24/24' is not limited to the surface of a substrate but may be selected from the group of surfaces consisting of semiconductor substrates, printed circuit boards, flex circuits, metallized substrates, glass substrates and semiconductor device mounting support.

The semiconductor substrate is selected from the group of substrates consisting of semiconductor substrates, ceramic substrates, glass substrates, gallium arsenide substrates, silicon substrates comprising a single layer of material, such as a silicon wafer or comprising silicon on insulator (SOI) technology and silicon on sapphire (SOS) technology, doped or undoped semiconductors, epitaxial layers of silicon supported by a base semiconductor, sapphire substrates or substrates used for flat panel displays.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for Edge Bead Remove (EBR), comprising:
   providing a substrate, said substrate having a perimeter, said perimeter having an edge;
   rounding said edge of said substrate, said edge having a differentiable convex upper profile after rounding;
   depositing a layer of semiconductor material over the substrate; and
   polishing said layer of semiconductor material.

2. The method of claim 1, said layer of semiconductor material comprising a low-k dielectric.

3. The method of claim 1, said layer of semiconductor material comprising a spin-on material.

4. The method of claim 1, said polishing comprising methods of Chemical Mechanical Polishing.

5. The method of claim 1, wherein said substrate is a monocrystalline silicon substrate.

6. The method of claim 1, wherein the substrate is a supporting surface.

7. The method of claim 6, wherein said supporting surface is a semiconductor substrate, a printed circuit board, a flex circuit, a metallized substrate, a glass substrate or a semiconductor device mounting support.

8. The method of claim 7, wherein the semiconductor substrate is a ceramic substrate, a glass substrate, a gallium arsenide substrate, a silicon substrate comprising a single layer of material, wherein the material comprises a silicon wafer or silicon on insulator (SOI) technology and silicon on sapphire (SOS) technology, a doped or undoped semiconductor, an epitaxial layer of silicon supported by a base semiconductor, a sapphire substrates or a substrate used for flat panel displays.

9. A method for Edge Bead Remove (EBR), comprising:
   providing a substrate;
   depositing a first layer of semiconductor material over the substrate, said first layer of semiconductor material having a perimeter, said perimeter having an edge;
   rounding said edge of said first layer of semiconductor material, said edge having a convex profile after rounding where said edge does not contact said substrate;
   depositing a second layer of semiconductor material over the layer of first layer of semiconductor material; and
   polishing said second layer of semiconductor material.

10. The method of claim 9, said second layer of semiconductor material comprising a low-k dielectric.

11. The method of claim 9, said second layer of semiconductor material comprising a spin-on material.

12. The method of claim 9, said polishing comprising methods of Chemical Mechanical Polishing.

13. The method of claim 9, wherein said substrate is a monocrystalline silicon substrate.

14. The method of claim 9, wherein said substrate is a supporting surface.

15. The method of claim 14, wherein said supporting surface is a semiconductor substrate, a printed circuit board, a flex circuit, a metallized substrate, a glass substrate or a semiconductor device mounting support.

16. The method of claim 15, wherein the semiconductor substrate is a ceramic substrate, a glass substrate, a gallium arsenide substrate, a silicon substrate comprising a single layer of material, wherein the material comprises a silicon wafer or silicon on insulator (SOI) technology and silicon on sapphire (SOS) technology, a doped or undoped semiconductor, an epitaxial layer of silicon supported by a base semiconductor, a sapphire substrates or a substrate used for flat panel displays.

17. A method for Edge Bead Remove (EBR), comprising:
   providing a substrate, said substrate having a perimeter, said perimeter having an edge;
   rounding said edge of said substrate, said edge having a profile comprising a convex curve and a concave portion after rounding;
   depositing a layer of semiconductor material over the substrate; and
   polishing said layer of semiconductor material.

18. The method of claim 17, said layer of semiconductor material comprising a low-k dielectric.

19. The method of claim 17, said layer of semiconductor material comprising a spin-on material.

20. The method of claim 17, said polishing comprising methods of Chemical Mechanical Polishing.

21. The method of claim 17, wherein said substrate is a monocrystalline silicon substrate.

22. The method of claim 17, wherein the substrate is a supporting surface.

23. The method of claim 22, wherein said supporting surface is a semiconductor substrate, a printed circuit board, a flex circuit, a metallized substrate, a glass substrate or a semiconductor device mounting support.

24. The method of claim 23, wherein the semiconductor substrate is a ceramic substrate, a glass substrate, a gallium arsenide substrate, a silicon substrate comprising a single layer of material, wherein the material comprises a silicon wafer or silicon on insulator (SOI) technology and silicon on sapphire (SOS) technology, a doped or undoped semiconductor, an epitaxial layer of silicon supported by a base semiconductor, a sapphire substrates or a substrate used for flat panel displays.

25. A method for processing a semiconductor wafer, comprising:

providing the semiconductor wafer, the semiconductor wafer having a first surface, a second surface, and an outer circumference, wherein the first surface is proximate to the outer circumference and the second surface is within the outer circumference and wherein the first and second surface transition with a sharp edge;

rounding a corner of the sharp edge;

applying a layer of material over the wafer, including the first and second surfaces and the rounded edge;

removing a portion of the layer over the first surface using an edge bead removal process.

* * * * *